US010635527B2

(12) United States Patent
Lin et al.

(10) Patent No.: US 10,635,527 B2
(45) Date of Patent: Apr. 28, 2020

(54) METHOD FOR PROCESSING DATA STORED IN A MEMORY DEVICE AND A DATA STORAGE DEVICE UTILIZING THE SAME

(71) Applicant: Silicon Motion, Inc., Jhubei (TW)

(72) Inventors: Wen-Sheng Lin, Kaohsiung (TW); Yu-Da Chen, Taipei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 16/039,767

(22) Filed: Jul. 19, 2018

(65) Prior Publication Data

US 2019/0095276 A1    Mar. 28, 2019

(30) Foreign Application Priority Data

Sep. 28, 2017 (TW) .............................. 106133361 A (51) Int. Cl.
| G11C 29/00 | (2006.01) |
| G06F 11/10 | (2006.01) |
| G06F 12/02 | (2006.01) |
| G11C 29/52 | (2006.01) |
| G06F 3/06 | (2006.01) |

(52) U.S. Cl.
CPC ............ *G06F 11/106* (2013.01); *G06F 3/061* (2013.01); *G06F 3/0608* (2013.01); *G06F 3/0647* (2013.01); *G06F 11/1048* (2013.01); *G06F 11/1068* (2013.01); *G06F 12/0253* (2013.01); *G11C 29/52* (2013.01); *G06F 3/064* (2013.01); *G06F 3/0619* (2013.01); *G06F 3/0659* (2013.01); *G06F 3/0679* (2013.01); *G06F 2212/7205* (2013.01)

(58) Field of Classification Search
CPC .. G06F 11/106; G06F 11/1068; G06F 3/0608; G06F 3/0647; G06F 3/061; G06F 3/0679; G06F 3/064; G06F 3/0619; G06F 3/0659
See application file for complete search history.

(56) References Cited

U.S. PATENT DOCUMENTS

| 2010/0122148 A1* | 5/2010 | Flynn ..................... G06F 11/108 714/773 |
| 2016/0070474 A1 | 3/2016 | Yu et al. |
| 2018/0018091 A1* | 1/2018 | Shin ..................... G06F 12/0246 |

FOREIGN PATENT DOCUMENTS

| TW | 201403318 A | 1/2014 |
| TW | 201608375 A | 3/2016 |

* cited by examiner

*Primary Examiner* — Samir W Rizk
(74) *Attorney, Agent, or Firm* — Wang Law Firm, Inc.

(57) ABSTRACT

A data storage device includes a memory device and a controller. The memory device includes multiple memory blocks. Each memory block includes multiple pages. The controller is coupled to the memory device and includes an ECC engine configured to check and correct errors that have occurred in data stored in the memory blocks. When a number of error bits in a page of one of the memory blocks exceeds a threshold, the controller is configured to add a block number of the memory block in a predetermined queue and when a garbage collection procedure has been triggered, the controller is configured to perform garbage collection on the memory block.

10 Claims, 5 Drawing Sheets

METHOD FOR PROCESSING DATA STORED IN A MEMORY DEVICE AND A DATA STORAGE DEVICE UTILIZING THE SAME

CROSS REFERENCE TO RELATED APPLICATIONS

This Application claims priority of Taiwan Patent Application No. 106133361, filed on Sep. 28, 2017, the entirety of which is incorporated by reference herein.

BACKGROUND OF THE INVENTION

Field of the Invention

The invention relates to a data processing method that is suitable for a flash memory device capable of efficiently processing the data stored in the memory device and further improving the performance of the memory device.

Description of the Related Art

With the rapid growth of data storage technology in recent years, many data storage devices— such as memory cards manufactured in compliance with the SD/MMC standards, CF standards, MS standards or XD standards, as well as solid state hard drives, Embedded Multi Media Cards (eMMC) and Universal Flash Storage (UFS)— have been used widely for a variety of purposes. Therefore, effective control of access to these data storage devices is an important issue.

In the following paragraphs, a novel data processing method is provided. By applying the data processing method, the data stored in the memory device can be efficiently processed and the performance of the memory device can be improved.

BRIEF SUMMARY OF THE INVENTION

A data storage device and a method for processing data stored in a memory device are provided. An exemplary embodiment of a data storage device comprises a memory device and a controller. The memory device comprises a plurality of memory blocks. Each memory block comprises a plurality of pages. The controller is coupled to the memory device and comprises an ECC engine configured to check and correct errors that have occurred in data stored in the memory blocks. When the number of error bits in a page of one of the memory blocks exceeds a threshold, the controller is configured to add a block number of the memory block in a predetermined queue and when the garbage collection procedure has been triggered, the controller is configured to perform garbage collection on the memory block.

An exemplary embodiment of a method for processing data stored in a memory device, suitable for a data storage device, the data storage device comprising a memory device and a controller, the memory device comprising a plurality of memory blocks, each memory block comprising a plurality of pages, and the method comprising: performing error checking and correcting on data stored in the memory blocks to determine whether the number of error bits in a page of one of the memory blocks exceeds a threshold; adding a block number of the memory block in a predetermined queue when the number of error bits in the page exceeds the threshold; and performing garbage collection on the memory block when the garbage collection procedure has been triggered.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims. It should be understood that the following embodiments may be implemented by software, hardware, firmware, or any combination of the above.

Figure 1A:
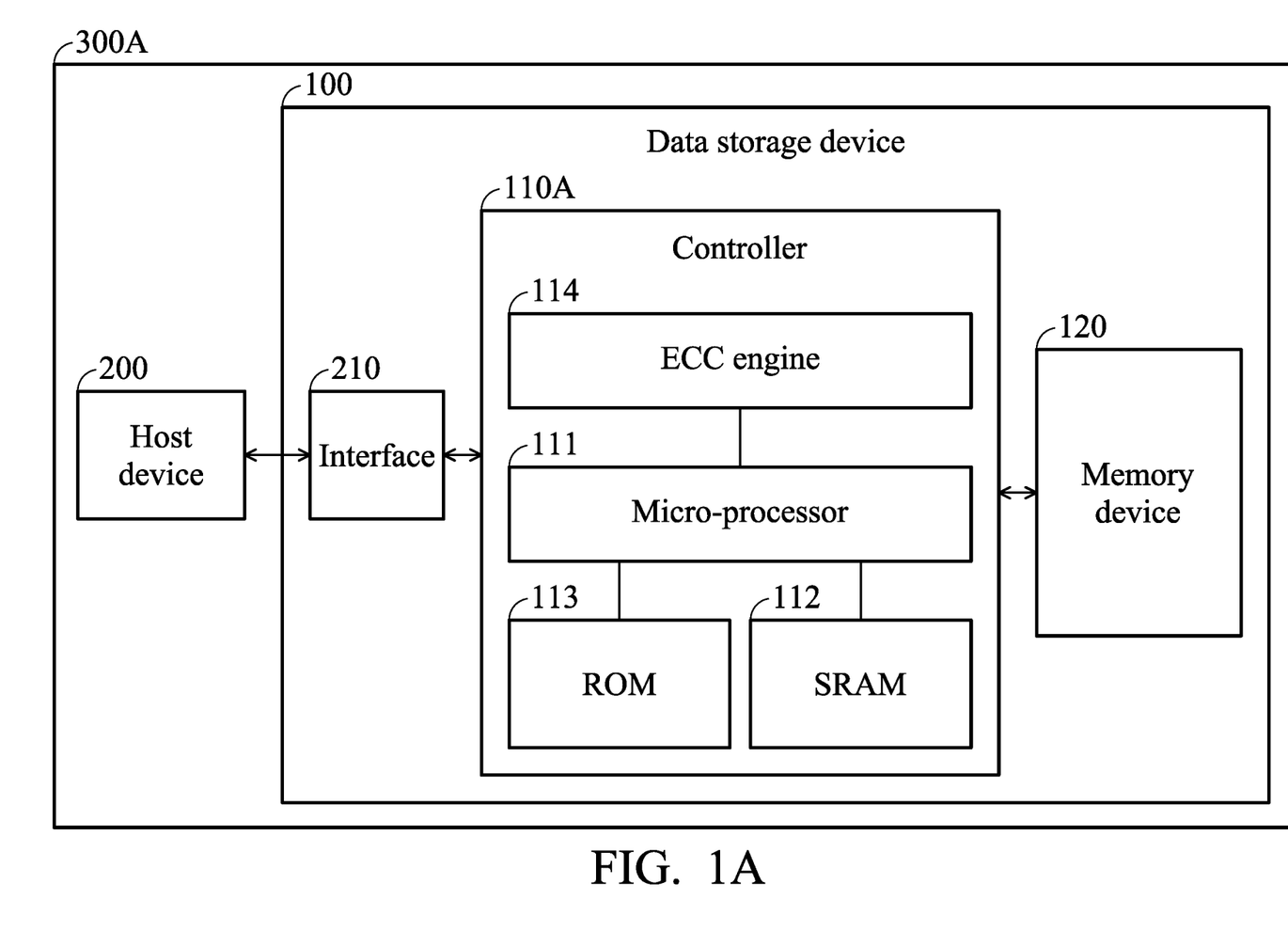
FIG. 1A shows an exemplary block diagram of an electronic device according to an embodiment of the invention.

FIG. 1A shows an exemplary block diagram of an electronic device according to an embodiment of the invention. The electronic device 300A may comprise a data storage device 100 and a host device 200. The electronic device 300A may be a mobile device, such as a smartphone, a smart watch, a tablet computer, etc., but the invention should not be limited thereto.

According to an embodiment of the invention, the data storage device 100 may comprise a controller 110A and a memory device 120. The controller 110A may comprise a micro-processor 111, a Static Random Access Memory (SRAM) 112, a Read Only Memory (ROM) 113 and an Error Correction Code (ECC) engine 114. The memory device 120 may comprise one or more non-volatile memory devices, such as a flash memory.

The micro-processor 111 may perform calculations and control the operation of circuits and devices within the controller 110A. The SRAM 112 and the ROM 113 are configured to store system data. The ECC engine 114 is configured to generate one or more parity check bits, utilized for performing error checking and correction on the data, according to the data content to be written to the memory device.

The host device 200 and the data storage device 100 are connected to each other via a predetermined interface 210. For example, when the data storage device 100 conforms to the Universal Flash Storage (UFS) standards, the interface 210 may be a UFS interface, and the data storage device 100 may be connected to the host device 200 through the interface 210. In another example, when the data storage device 100 conforms to the eMMC standards, the interface 210 may be an MMC interface, and the data storage device 100 may be connected to the host device 200 through the interface 210.

Figure 1B:
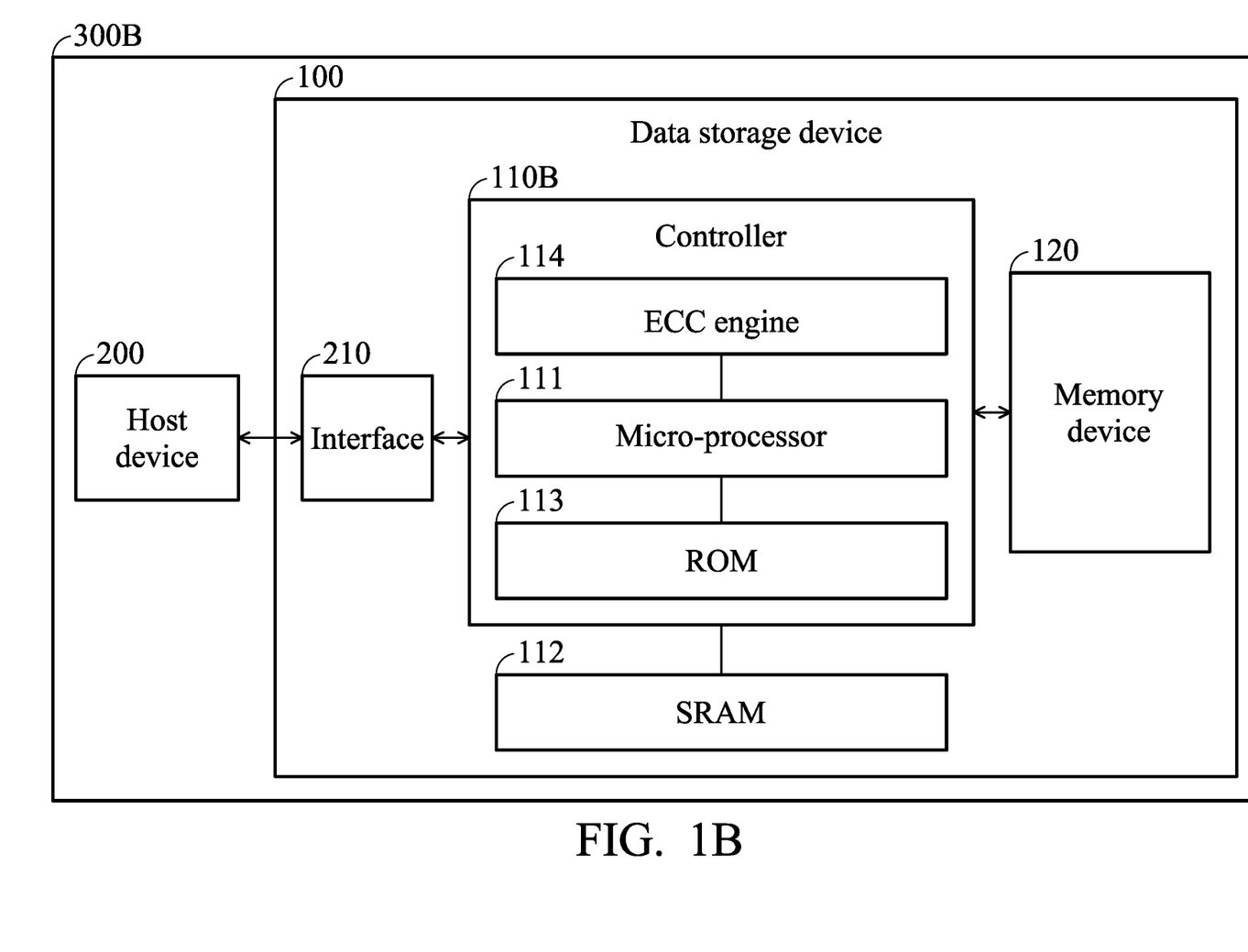
FIG. 1B shows a block diagram of an electronic device according to another embodiment of the invention.

FIG. 1B shows a block diagram of an electronic device 300B according to another embodiment of the invention. In this embodiment, the SRAM 112 is configured outside of the controller 110B and is coupled to the controller 110B.

It should be noted that, to simplify the description, FIG. 1A and FIG. 1B only show the elements related to the invention, and FIG. 1A and FIG. 1B only show two kinds of a plurality of architectures to which the invention can be applied. However, the implementation of the invention is not limited to the elements and architectures shown in FIG. 1A and FIG. 1B.

According to an embodiment of the invention, the memory device 120 may comprise a plurality of memory blocks. The memory blocks may be a plurality of Single Level Cell (SLC) blocks and/or a plurality of Multiple Level Cell (MLC) blocks. Each memory cell in the SLC block stores one bit data, and each memory cell in the MLC block stores multiple bits of data. For example, according to an embodiment of the invention, each memory cell in the MLC block stores two bits of data. According to another embodiment of the invention, the MLC block may be the Triple Level Cell (TLC) block, and each memory cell in the TLC block stores three bits of data.

Each memory block may comprise a plurality of pages. Generally, in the flash memory device, one page is a minimum data block unit for a write task, and one block is a minimum data block unit for an erase task. The size of a physical page is fixed, and the size of a logical page can be flexibly designed according to the firmware programming requirements.

As discussed above, the ECC engine 114 is configured to generate parity check bits according to the content of the data to be written to the memory device, so as to check and correct the error occurred in the data stored in the memory device. In current designs, when an uncorrectable error (that is, an error that cannot be corrected by the ECC engine, also called an Uncorrectable UECC error (UECC Error)) has been detected in the data stored in one page, or when the number of error bits in one page exceeds a threshold, the memory block comprising this page is directly marked as a bad block (in a mark bad operation).

Generally, the controller 110A/110B is configured to record the corresponding block number (or, the block index) of this memory block in a bad memory block table. The memory blocks with whose corresponding block number recorded in the bad memory block table will become a read-only memory block. That is, the controller 110A/110B can only perform read operation on the bad block thereafter, and cannot further perform any other operations such as a write operation, an erase operation or a garbage collection operation. The bad block will be no longer released a usable memory block.

However, since the bad block can still be read, the risk of further damaging the remaining valid pages in the bad block will be increased as the read count is increased. Here, the valid page means that the logical page pointed to by the data stored on this page is not duplicated with the logical page pointed to by the data stored in other pages. That is, the data stored in this page is the latest data, and the mapping relationship of this logical page stored in the "Logical to Physical mapping table" has not been deleted. When the data stored in one page is the latest data of a logical page, and the mapping relationship of this logical page stored in the "Logical to Physical mapping table" has not been deleted, the page is regarded as a valid page.

As discussed above, when the memory block is marked as a bad block, this memory block becomes a read-only memory block. Therefore, the data stored in the valid page of this memory block cannot be moved. As this time, when the data stored in the remaining valid page undergoes a certain amount of read operations, it may also be damaged, causing the undesired data error problem.

To solve the problem as discussed above, a method for processing data stored in a memory device is proposed. In the proposed data processing method, when the data stored in one page is detected as comprising an uncorrectable error, or the number of error bits in this page exceeds a threshold, the memory block comprising this page will not be directly marked as a bad block. In the proposed data processing method, the controller 110A/110B is configured to mark the memory block as a bad block only after all valid pages in this memory block have been moved to a destination block, so as to solve the undesired data error problem as discussed above. The proposed data processing method will be further discussed in the following paragraphs.

According to an embodiment of the invention, when the controller 110A/110B or the ECC engine 114 detects that the data stored in one page comprises uncorrectable errors, or when the number of error bits in this page (hereinafter called a "damaged page") exceeds a threshold, the controller 110A/110B is configured not to directly mark the memory block (hereinafter called "predetermined memory block") comprising this damaged page as a bad block. Instead of directly marking the predetermined memory block as a bad block, the controller 110A/110B is configured to add the block number corresponding to the predetermined memory block into a predetermined queue. After that, when the garbage collection procedure has been triggered, the controller 110A/110B is configured to perform garbage collection on the predetermined memory block.

It should be noted that, in the embodiment of the invention, before the controller 110A/110B performs the garbage collection on the predetermined memory block, the controller 110A/110B will not to mark the predetermined memory block as a bad block. That is, the controller 110A/110B will not record the corresponding block number of the predetermined memory block in a bad memory block table until the garbage collection operation on the predetermined memory block has been completed.

In the embodiment of the invention, when the garbage collection procedure has been triggered, the controller 110A/110B is configured to perform garbage collection on the predetermined memory block, so as to move the data stored in all the valid pages (that is, valid and undamaged pages) to a destination block (that is, a destination memory block). After the controller 110A/110B moved all valid pages of the predetermined memory block to the destination block, the controller 110A/110B is configured to mark the predetermined memory block as a bad block. Here, the operation of moving the data comprises operations of data copying (copying the data stored in the source block) and data writing (writing the data to the destination block).

In the garbage collection procedure, the controller 110A/110B is configured to select a source block (that is, the source memory block), read the data stored in the valid pages of the source block, and write the data to the destination block. According to an embodiment of the invention, after all the data stored in the valid pages of the predetermined memory block has been moved to the destination block, the predetermined memory block is marked as a bad block. For any memory block not comprising any damaged page, the memory block will be released after the garbage collection procedure and can be reused in subsequent memory access operations.

Figure 2:
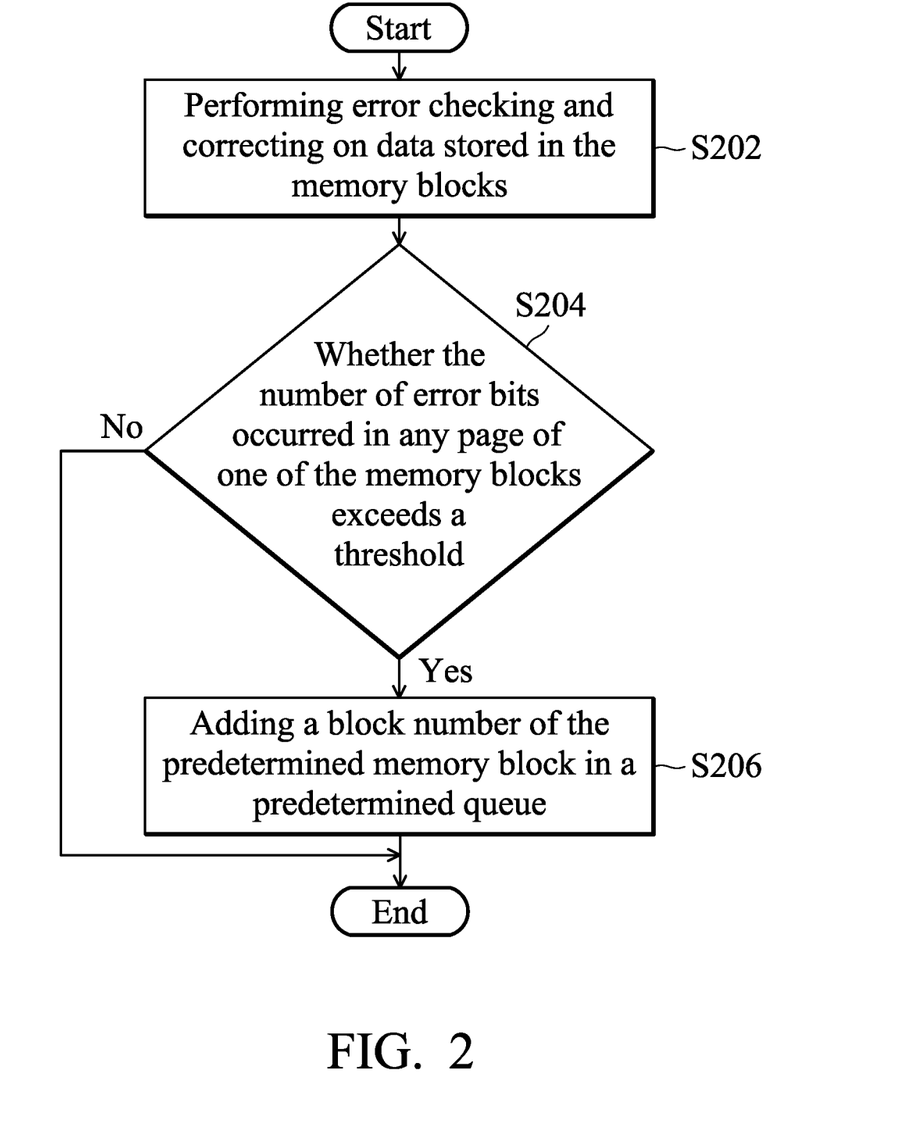
FIG. 2 is an exemplary flow chart of a data processing method according to an embodiment of the invention.

FIG. 2 is an exemplary flow chart of a data processing method according to an embodiment of the invention. First of all, the ECC engine 114 is configured to perform error checking and correcting on data stored in the memory blocks (Step S202), so as to determine whether the number of error bits in any page of any one of the memory blocks exceeds a threshold. According to an embodiment of the invention, step S202 may be performed when reading the data. For example, step S202 may be performed when the host device 200 plans to read data from the memory device 120 or when the controller 110A/110B plans to read data from the memory device. According to another embodiment of the invention, step S202 may be performed during garbage collection. For example, when the controller 110A/110B plans to perform garbage collection on a memory block, the controller 110A/110B may instruct the ECC engine 114 to perform an error check and correction on the data stored in the memory block.

When one or more error bits are detected, the ECC engine 114 is configured to try to correct the error bits by using different levels of error correction code. For example, the ECC engine 114 may determine whether the number of error bits exceeds a maximum correctable number. When the number of error bits does not exceed the maximum correctable number, it means that the ECC engine 114 is able to correct the error bits. When the number of error bits exceeds the maximum correctable number, it means that the ECC engine 114 is unable to correct the error bits. In other words, according to an embodiment of the invention, when the number of error bits in a page of one of the memory blocks exceeds a threshold (e.g. the maximum correctable number as discussed above), the ECC engine 114 may determine that data stored in the page comprises uncorrectable errors.

In the embodiments of the invention, the controller 110A/110B or the ECC engine 114 may determine whether the number of error bits in any page of one of the memory blocks exceeds a threshold (Step S204). The threshold may be set to be equal or not equal to the maximum correctable number as discussed above. Generally, the threshold may be set to be smaller than the maximum correctable number of the ECC engine 114.

When the controller 110A/110B or the ECC engine 114 determines that one page is a damaged page (that is, the number of error bits in this page exceeds a threshold), the controller 110A/110B may add a block number of the predetermined memory block comprising the damaged page in a predetermined queue (Step S206). Thereafter, when the garbage collection procedure has been triggered, the controller 110A/110B may perform garbage collection on the predetermined memory block.

According to an embodiment of the invention, the controller 110A/110B may perform garbage collection based on the predetermined queue. According to another embodiment of the invention, the controller 110A/110B may not perform garbage collection based on the predetermined queue. Details will be discussed in the following paragraphs.

Usually, the garbage collection procedure is further divided into a normal garbage collection procedure and a special garbage collection procedure. When performing the normal garbage collection procedure, the controller 110A/110B is configured to select the source block based on a valid page count VP_Count of the memory block. Generally, the controller 110A/110B preferentially selects the memory block having a small valid page count VP_Count as the source block to perform the garbage collection.

The controller 110A/110B may establish a valid page count table in the SRAM 112 or the memory device 120 for recording a valid page count VP_Count corresponding to each memory block, wherein the basic unit for recording the valid page count of one page may be one logical page. Therefore, the maximum possible value of the valid page count VP_Count is the number of logical pages comprised in one memory block, and the minimum value thereof is 0.

The controller 110A/110 may usually update the content of the valid page count table after each write operation.

On the other hand, when performing the special garbage collection procedure, the controller 110A/110 may select the source block based on a special garbage collection queue. The special garbage collection queue may record the block number of the memory block on which the system would like to perform garbage collection. For example, when the controller 110A/110B determines that the erase count of one page or one memory block exceeds an erase count threshold, the read count thereof exceeds a read threshold, the error bits occurred therein exceeds a threshold, or when other special condition is met, the block number of the corresponding memory block or the block number of the corresponding memory block comprising that page is added into the special garbage collection queue.

When performing the special garbage collection procedure, the controller 110A/110B is configured to select the corresponding memory block as the source block based on the order of the block number recorded in the special garbage collection queue, and perform garbage collection on the selected the source block.

In addition, the controller 110A/110B is configured to determine whether to perform a normal garbage collection procedure or a special garbage collection procedure based on the current system requirement of the data storage device 100. For example, when the number of remaining spare memory block of the data storage device is smaller than a predetermined value, the controller 110A/110B may determine to perform a normal garbage collection procedure.

In the embodiments of the first aspect of the invention, the predetermined queue is the special garbage collection queue. That is, when the controller 110A/110B or the ECC engine 114 determines that one page is a damaged page, the controller 110A/110B is configured to add the block number of the predetermined memory block comprising this damaged page in the special garbage collection queue. After that, when a normal garbage collection procedure or a special garbage collection procedure has been triggered, the controller 110A/110B is configured to perform garbage collection on the predetermined memory block.

According to a first embodiment of the first aspect of the invention, when a special garbage collection procedure has been triggered, the controller 110A/110B is configured to perform garbage collection based on the special garbage collection queue. Because the controller 110A/110B has already added the block number of the predetermined memory block in the special garbage collection queue, the controller 110A/110B is able to perform garbage collection on the predetermined memory block based on the special garbage collection queue.

When the controller 110A/110B has moved all valid pages of the predetermined memory block to a destination block in the special garbage collection procedure, the controller 110A/110B is configured to mark the predetermined memory block as a bad block and delete the block number of the predetermined memory block from the special garbage collection queue.

When the destination block utilized for performing the current special garbage collection procedure is full, the current special garbage collection procedure is finished.

It should be noted that, when the destination block utilized for performing the current garbage collection procedure is full but not all valid pages of the predetermined memory block have been moved to the destination block, the controller 110A/110B is configured to preferentially select the predetermined memory block as a source block when the next special garbage collection procedure has been triggered since the corresponding block number of the predetermined memory block is still recorded in the special garbage collection queue. Therefore, moving of the data stored in the remaining valid page of the predetermined memory block will be performing preferentially in the next special garbage collection procedure.

In addition, it should be noted that in this case, the controller 110A/110B may also dynamically adjust the order of the block number corresponding to the predetermined memory block in the special garbage collection queue, so as to ensure that the controller 110A/110B will preferentially select the predetermined memory block as a source block when the next special garbage collection procedure has been triggered.

According to a second embodiment of the first aspect of the invention, when a normal garbage collection procedure has been triggered, the controller 110A/110B may also not perform garbage collection based on the predetermined queue. As discussed above, the controller 110A/110B may select the source block based on the valid page count VP_Count of the memory block. Therefore, when the valid page count VP_Count of the predetermined memory block comprising the damaged page is relatively small or is sufficient small, it would be possible for the controller 110A/110B to perform garbage collection on the predetermined memory block in a current normal garbage collection procedure.

When the controller 110A/110B has moved all valid pages of the predetermined memory block to a destination block in the normal garbage collection procedure, the controller 110A/110B is configured to mark the predetermined memory block as a bad block.

When the destination block utilized for performing the current normal garbage collection procedure is full, the current normal garbage collection procedure is finished.

It should be noted that, when the destination block utilized for performing the current garbage collection procedure is full but not all valid pages of the predetermined memory block have been moved to the destination block, the controller 110A/110B is configured to use a variable to record the block number of the predetermined memory block. In this manner, when the next normal garbage collection procedure has been triggered, the controller 110A/110B may first check whether the variable records a block number. When the variable records the block number of a predetermined memory block, the controller 110A/110B may preferentially select the predetermined memory block as a source block in the next normal garbage collection procedure. Therefore, moving of the data stored in the remaining valid page of the predetermined memory block will be performing preferentially in the next normal garbage collection procedure. In other words, even if the valid page count VP_Count of the predetermined memory block is not the smallest one, the 110A/110B will still preferentially select the memory block as a source block when the next normal garbage collection procedure has been triggered.

In addition, it should be noted that if the controller 110A/110B detects that there is another memory block comprising a damaged page when the controller 110A/110B is performing the normal garbage collection procedure, the controller 110A/110B may also mark this memory block as a bad block after all valid pages of this memory block have been moved to the destination block, or the controller 110A/110B may use a variable to record the block number of this memory block if the destination block utilized for performing the current normal garbage collection procedure is full but not all valid pages of this memory block have been moved to the destination block, such that the controller 110A/110B may preferentially move the remaining valid page(s) of this memory block to the destination block in the next normal garbage collection procedure.

On the other hand, in the embodiments of the second aspect of the invention, the above-mentioned predetermined queue is an UECC garbage collection queue different from the special garbage collection queue. That is, when the controller 110A/110B or the ECC engine 114 determines that one page is a damaged page, the controller 110A/110B may add a block number of the predetermined memory block comprising this damaged page in an UECC garbage collection queue. After that, when a normal garbage collection procedure or a special garbage collection procedure has been triggered, the controller 110A/110B is configured to preferentially perform garbage collection on the memory block(s) recorded in the UECC garbage collection queue.

Therefore, in the embodiments in the second embodiments of the invention, no matter whether a normal garbage collection procedure or a special garbage collection procedure is trigger, the controller 110A/110B is configured to preferentially check whether there is any block number of the memory block recorded in the UECC garbage collection queue. If there is, the controller 110A/110B is configured to preferentially perform garbage collection on the memory block(s) recorded in the UECC garbage collection queue.

According to a first embodiment of the second aspect of the invention, when the special garbage collection procedure has been triggered, the controller 110A/110B is configured to perform garbage collection based on the UECC garbage collection queue, first, and then perform garbage collection based on the special garbage collection queue.

Similarly, when the controller 110A/110B has moved all valid pages of the predetermined memory block to a destination block in the special garbage collection procedure, the controller 110A/110B is configured to mark the predetermined memory block as a bad block and delete the block number of the predetermined memory block from the UECC garbage collection queue.

When the destination block utilized for performing the special garbage collection procedure is full, the special garbage collection procedure is finished.

It should be noted that, when the destination block utilized for performing the current garbage collection procedure is full but not all valid pages of the predetermined memory block have been moved to the destination block, the controller 110A/110B is configured to preferentially select the predetermined memory block as a source block when the next special garbage collection procedure or the next normal garbage collection procedure has been triggered since the corresponding block number of the predetermined memory block is still recorded in the UECC garbage collection queue.

According to a second embodiment of the second aspect of the invention, when the normal garbage collection procedure has been triggered, the controller 110A/110B is configured to perform garbage collection based on the UECC garbage collection queue, first, and then select the source block based on the valid page count VP_Count of the memory blocks for performing the normal garbage collection.

When the controller 110A/110B has moved all valid pages of the predetermined memory block to a destination block in the normal garbage collection procedure, the controller 110A/110B is configured to mark the predetermined memory block as a bad block and delete the block number of the predetermined memory block from the UECC garbage collection queue.

When the destination block utilized for performing the current normal garbage collection procedure is full, the current normal garbage collection procedure is finished.

It should be noted that, when the destination block utilized for performing the current garbage collection procedure is full but not all valid pages of the predetermined memory block have been moved to the destination block, the controller 110A/110B is configured to preferentially select the memory block as a source block when the next special garbage collection procedure or the next normal garbage collection procedure has been triggered since the corresponding block number of the predetermined memory block is still recorded in the UECC garbage collection queue.

In addition, as discussed above, it should be noted that, if the controller 110A/110B detects that there is another memory block comprising a damaged page when the controller 110A/110B is performing the normal garbage collection procedure, the controller 110A/110B may also mark this memory block as a bad block after all valid pages of this memory block have been moved to the destination block, or the controller 110A/110B may add the block number of this memory block in the UECC garbage collection queue if the normal garbage collection procedure is finished but not all valid pages of this memory block have been moved to the destination block. In this manner, the controller 110A/110B may preferentially select this memory block as a source block when the next special garbage collection procedure or the next normal garbage collection procedure has been triggered, and preferentially move the remaining page(s) of this memory block to the destination block in the next garbage collection procedure.

Figure 3A:
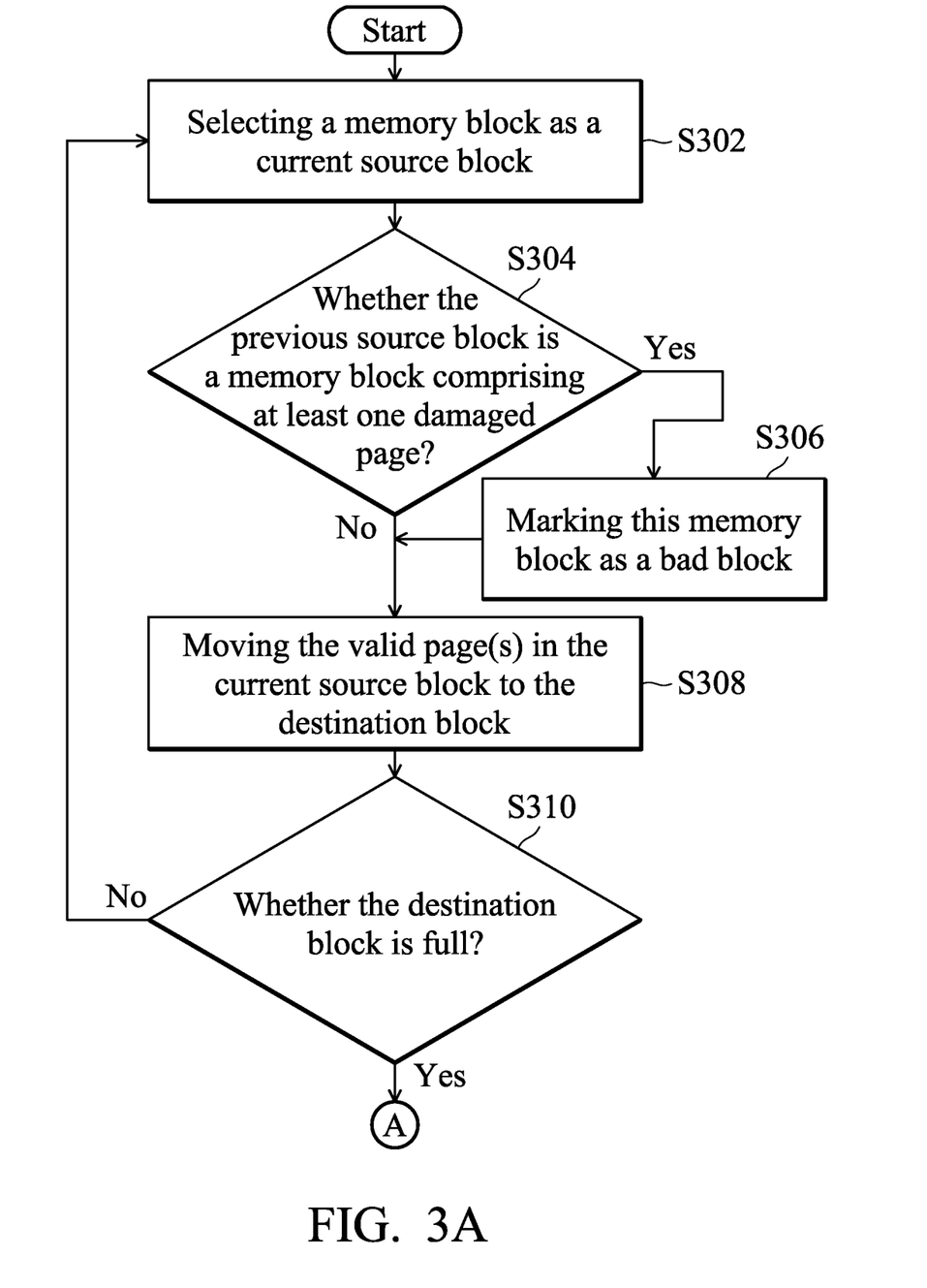
FIG. 3A and FIG. 3B show the exemplary flow chart of performing a garbage collection procedure according to an embodiment of the invention.
Figure 3B:
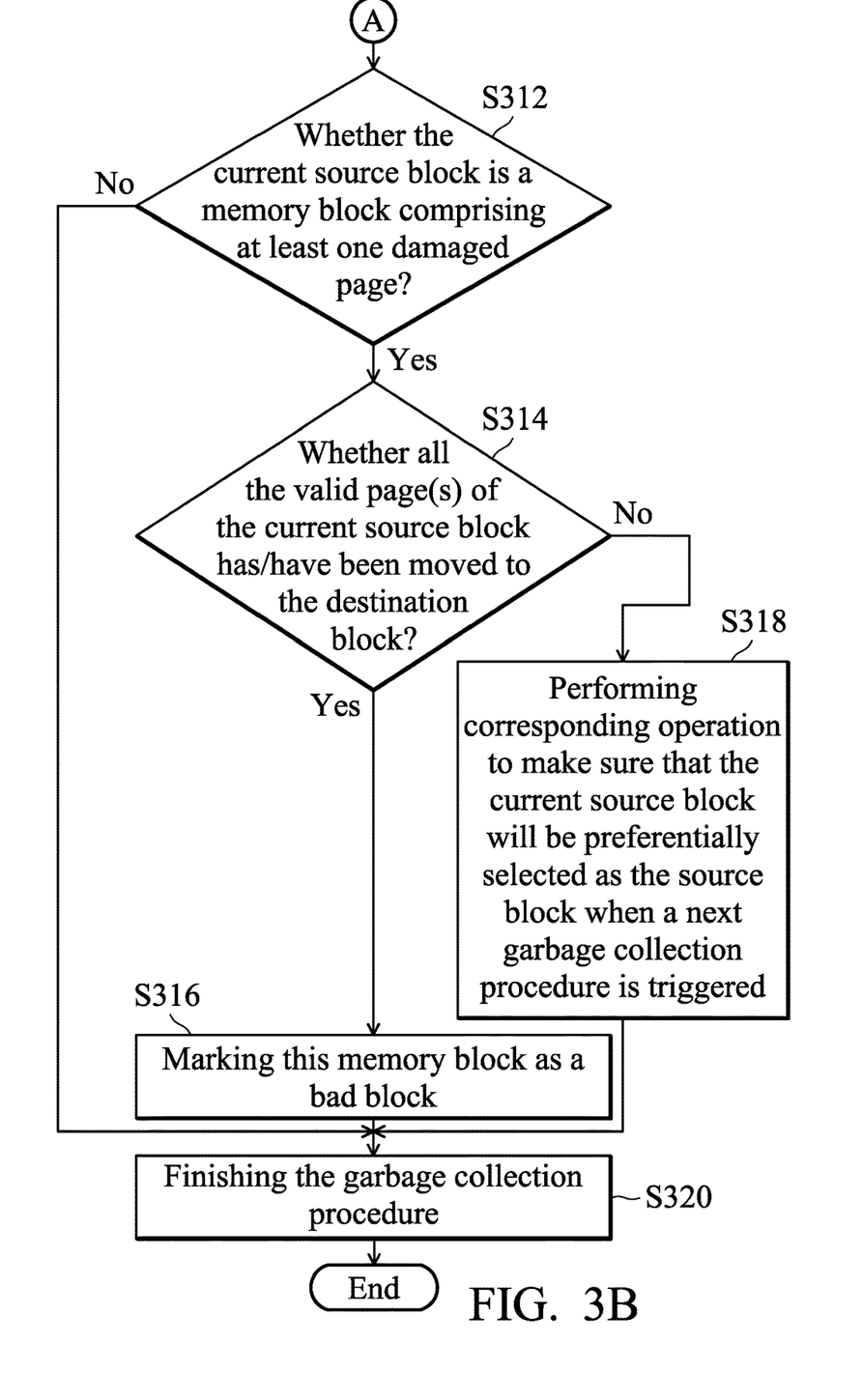

FIG. 3A and FIG. 3B show the exemplary flow chart of performing the garbage collection procedure according to an embodiment of the invention. First of all, when the garbage collection procedure (a special garbage collection procedure or a normal garbage collection procedure) has been triggered, the controller 110A/110B is configured to select a memory block as a current source block (step S302). As discussed above, according to the first embodiment of the first aspect of the invention, in the special garbage collection procedure, the controller 110A/110B is configured to select a memory block as a current source block based on the special garbage collection queue. According to the second embodiment of the first aspect of the invention, in the normal garbage collection procedure, the controller 110A/110B is configured to select a memory block as a current source block based on the above-mentioned variable and the corresponding valid page count VP_Count of the memory block. In addition, in the embodiments of the second aspect of the invention, in the normal garbage collection procedure and the special garbage collection procedure, the controller 110A/110B preferentially select a memory block as a current source block based on the UECC garbage collection queue.

Next, the controller 110A/110B is configured to determine whether the previous source block is a memory block comprising at least one damaged page (step S304). If yes, since the garbage collection for the previous source block is completed, that is, all the valid page(s) of the previous source block has/have been moved to a destination block, the controller 110A/110B is configured to mark this memory block as a bad block (step S306).

If not, or after this memory block is marked as a bad block in step S306, the controller 110A/110B is configured to move the valid page(s) of the current source block to the destination block (step S308), and determine whether the destination block is full (step S310). If not, the procedure returns to step S302 to select the source block. If yes, the controller 110A/110B is configured to determine whether the current source block is a memory block comprising at least one damaged page (step S312). If not, the garbage collection procedure is finished (step S320).

If yes, the controller 110A/110B is configured to further check whether all the valid page(s) of the current source block has/have been moved to the destination block (step S314). If yes, the controller 110A/110B is configured to mark this memory block as a bad block (step S316), and the garbage collection procedure is finished (step S320).

If not, the controller 110A/110B is configured to perform the corresponding operation to make sure that the current source block will be preferentially selected as the source block when the next garbage collection procedure is triggered (step S318). As discussed above, the controller 110A/110B may use a variable to record the block number of the current source block, or add the block number of the current source block in the UECC garbage collection queue, or not delete the block number of the current source block from the UECC garbage collection queue, or adjust the order of the block numbers recorded in the UECC garbage collection queue, so as to make sure that the current source block will be preferentially selected as the source block when the next garbage collection procedure is triggered.

In the embodiments of the invention, since the memory block will not be directly marked as the bad block after a damaged page comprised therein has been detected, and will be marked as the bad block after all valid page(s) comprised therein has/have been moved to the destination block, the undesired data error problem as discussed above can be solved. In addition, the data stored in the memory device can be efficiently processed and performance of the memory device can be improved.

The term "coupled" in the specification of the invention generally refers to various direct or indirect electrical connections. While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
   a memory device, comprising a plurality of memory blocks, each memory block comprising a plurality of pages; and
   a controller, coupled to the memory device and comprising an ECC engine configured to check and correct errors that have occurred in data stored in the memory blocks,
   wherein when a number of error bits in a page of one of the memory blocks exceeds a threshold, the controller is configured to add a block number of the memory block in a predetermined queue, and when a garbage collection procedure has been triggered, the controller is configured to perform garbage collection on the memory block;
   wherein before the controller performs the garbage collection on the memory block, the controller is configured not to mark the memory block as a bad block.

2. The data storage device as claimed in claim 1, wherein when the number of error bits in the page exceeds the threshold, the data stored in the page comprises an uncorrectable error.

3. The data storage device as claimed in claim 2, wherein after the controller moved all valid pages of the memory block to a destination block, the controller is configured to mark the memory block as a bad block.

4. The data storage device as claimed in claim 1, wherein the controller is configured to perform the garbage collection procedure based on the predetermined queue.

5. The data storage device as claimed in claim 1, wherein when a destination block utilized for performing the garbage collection procedure is full but not all valid pages of the memory block have been moved to the destination block, the controller is configured to preferentially select the memory block as a source block when a next garbage collection procedure has been triggered.

6. A method for processing data stored in a memory device, suitable for a data storage device, the data storage device comprising a memory device and a controller, the memory device comprising a plurality of memory blocks, each memory block comprising a plurality of pages, the method comprising:

performing error checking and correcting on data stored in the memory blocks to determine whether a number of error bits in a page of one of the memory blocks exceeds a threshold;

adding a block number of the memory block in a predetermined queue when the number of error bits in the page of the memory block exceeds the threshold; and performing garbage collection on the memory block when a garbage collection procedure has been triggered;

not marking the memory block as a bad block before performing the garbage collection on the memory block.

7. The method as claimed in claim 6, wherein when the number of error bits in the page exceeds the threshold, the data stored in the page comprises an uncorrectable error.

8. The method as claimed in claim 7, further comprising:
marking the memory block as a bad block after all valid pages of the memory block have been moved to a destination block.

9. The method as claimed in claim 6, further comprising:
performing the garbage collection procedure based on the predetermined queue.

10. The method as claimed in claim 6, further comprising:
preferentially selecting the memory block as a source block in a next garbage collection procedure when a destination block utilized for performing the garbage collection procedure is full but not all valid pages of the memory block have been moved to the destination block.

* * * * *